United States Patent [19]
Cheng

[11] Patent Number: 6,161,611
[45] Date of Patent: Dec. 19, 2000

[54] RADIATOR

[75] Inventor: Yao-Tsung Cheng, Taipei Hsien, Taiwan

[73] Assignee: Asai Vital Components Co., Ltd., Taipei Hsien, Taiwan

[21] Appl. No.: 09/350,116

[22] Filed: Jul. 9, 1999

[51] Int. Cl.[7] .................................................. H05K 7/20
[52] U.S. Cl. ...................... 165/80.3; 165/185; 257/719; 361/704
[58] Field of Search ................................. 165/80.3, 185; 361/697, 704, 710; 257/719, 722

[56] References Cited

U.S. PATENT DOCUMENTS

| | | | |
|---|---|---|---|
| 5,757,619 | 5/1998 | Imai et al. | 361/697 |
| 5,886,873 | 4/1999 | Ahn | 361/719 |
| 6,046,906 | 9/1998 | Tseng | 361/704 |

*Primary Examiner*—Allen Flanigan
*Attorney, Agent, or Firm*—Bacon & Thomas, PLLC

[57] ABSTRACT

A radiator includes a radiating structure and two buckling devices. Channels are formed between the outermost two radiating fins and adjacent radiating fins. Openings are formed at one side of each of the two buckling devices for buckling with a CPU frame. Other side of the buckling device is protruded with respect to the two buckling pieces. A buckling portion is formed at the front lower surface of each buckling piece for insertion into the channel and is buckled into the buckling hole. A stopping rod protruded from the outer rim of the lower side of the buckling device, and is inserted into the slot for matching the resisting force for buckling the buckling device by the buckling pieces so that the buckling device will not separate from the radiating fins.

6 Claims, 6 Drawing Sheets

RADIATOR

FIELD OF THE INVENTION

The present invention relates to a radiator structure having other upright or transversal radiating fins formed by compressing and for assembly to a CPU.

BACKGROUND OF THE INVENTION

In manufacturing the radiating fins of a radiator, heated aluminum or an alloy thereof is compressed in a mold. The known radiating fins are of two kinds, including upright radiating fins and transversal radiating fins. An assembly of transversal radiating fins 10, as shown in FIG. 1, are cut to a predetermined length after compressing. The radiating fins 11 at two opposite sides are then cut to form outwardly extending pieces 12. Each extending piece 12 is punched to form a concave opening 13 for buckling with a CPU frame (not shown). An assembly of upright radiating fins is shown in FIG. 2. After compressing, two smooth extending pieces 21 are also directly formed at two sides thereof. Then, a concave opening 22 is punched in each extending piece 21. Thus, for either transversal or upright radiating fins, a punching process is necessary, which process is both tedious and costly.

SUMMARY OF THE INVENTION

Accordingly, the primary object of the present invention is to provide a radiator structure including a radiating fin assembly and two buckling devices. The fin assembly may be upright or transversal and are formed by compressing, and can be assembled to the CPU without punching or cutting the fins. Each buckling device is formed with a concave opening and perform the same functions and have the same configuration as those found in prior art radiators. Therefore, the known punching or smoothing process is unnecessary, thereby saving manufacturing costs.

The various objects and advantages of the present invention will be more readily understood from the following detailed description thereof when read in conjunction with the appended drawings.

DETAILED DESCRIPTION OF THE PREFERRED EMBODIMENTS

Figure 1:
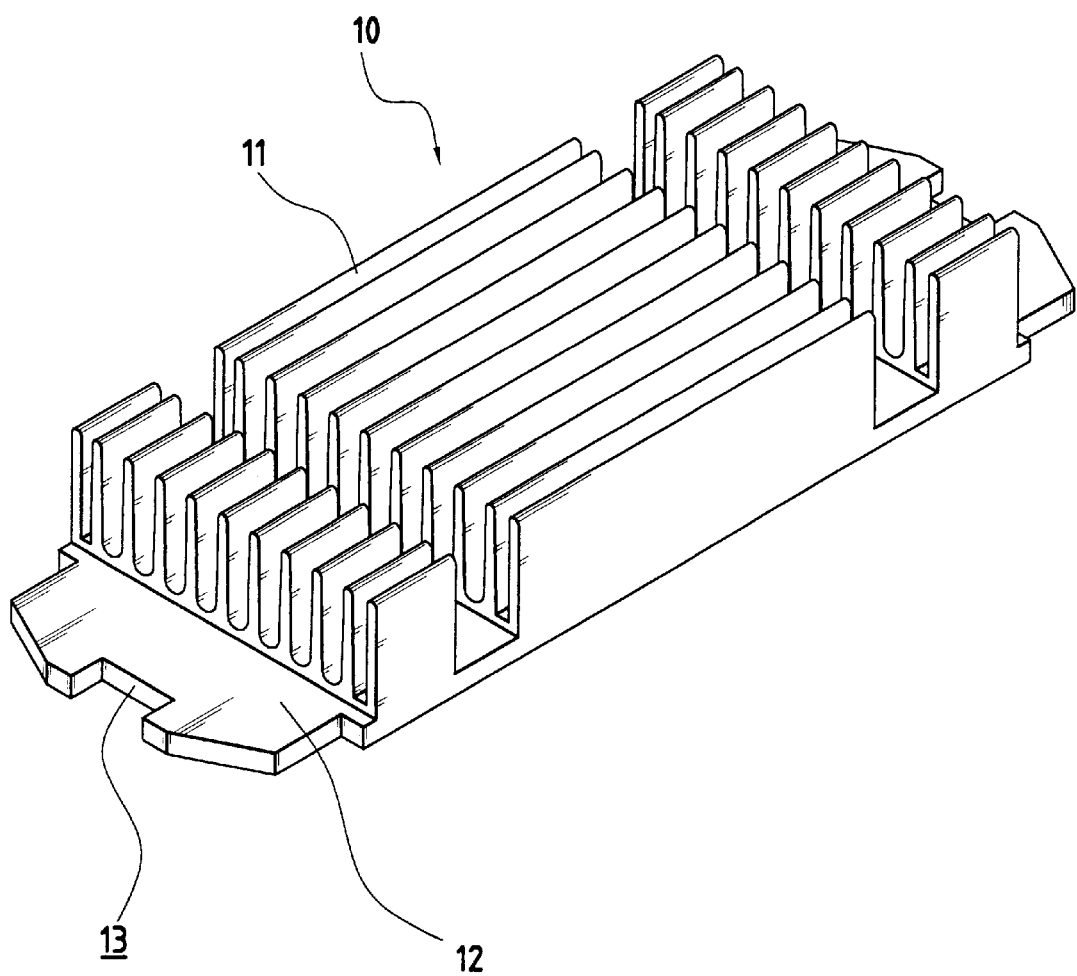
FIG. 1 is a perspective view of a transversal radiating fin assembly in a prior art radiator.
Figure 2:
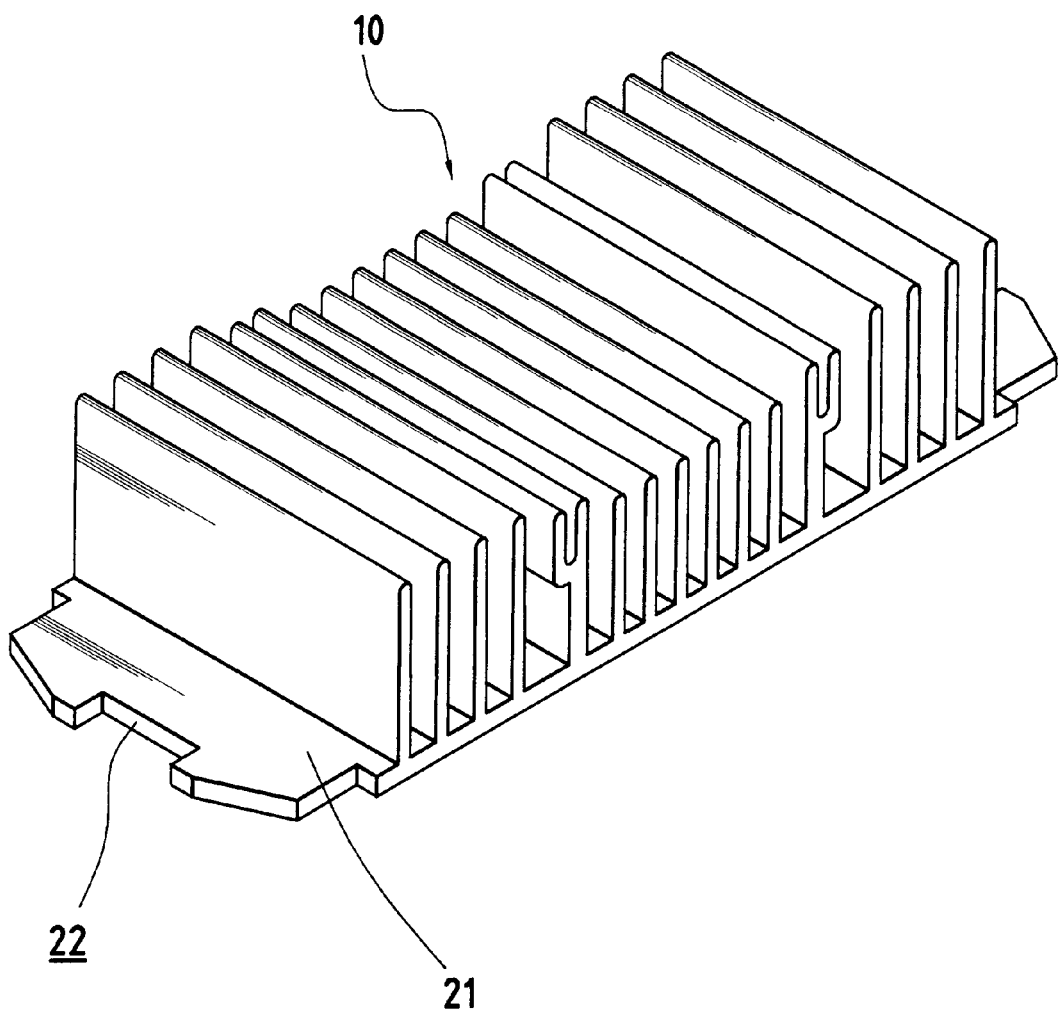
FIG. 2 is a perspective view of an upright radiating fin assembly in a prior art radiator.
Figure 3:
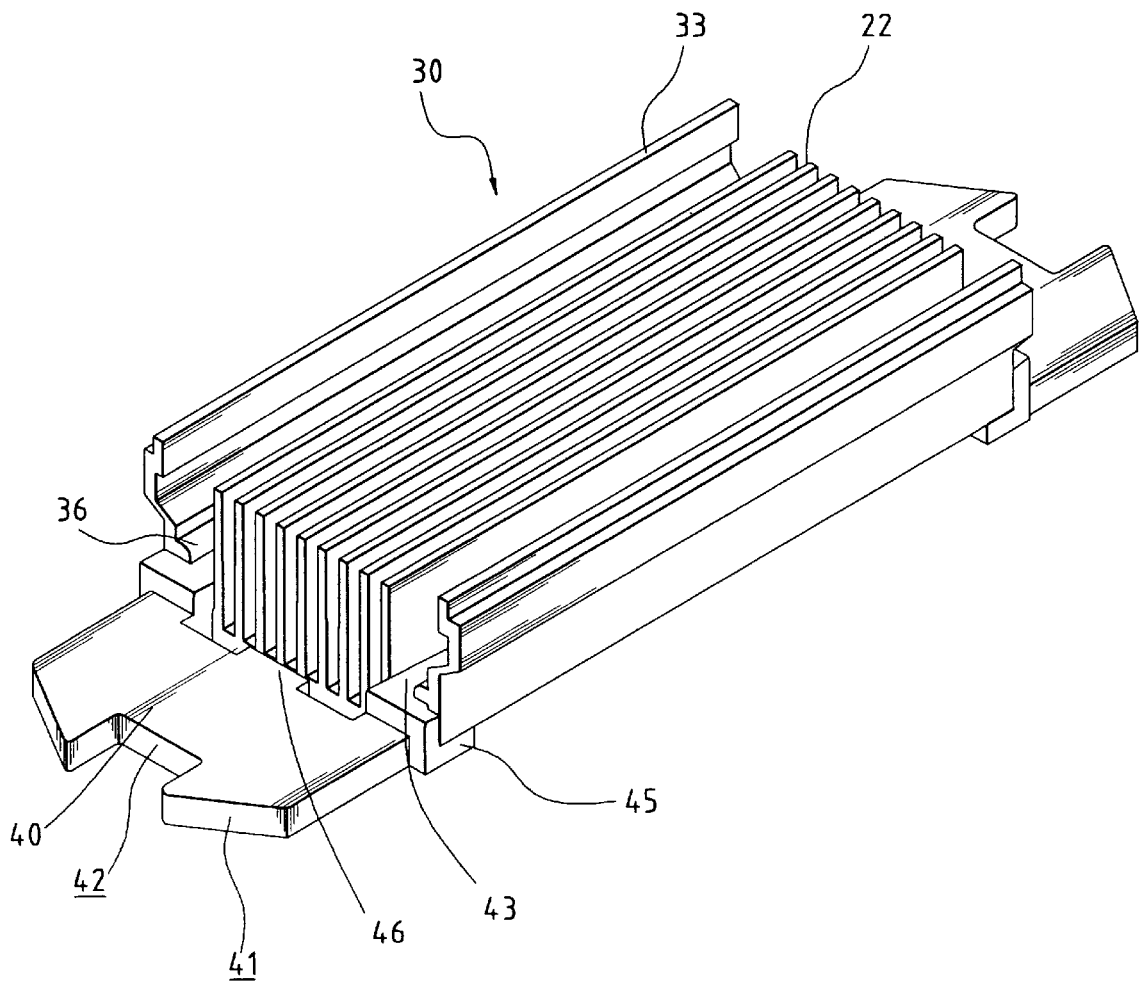
FIG. 3 is a perspective view showing a radiator of the present invention.
Figure 4:
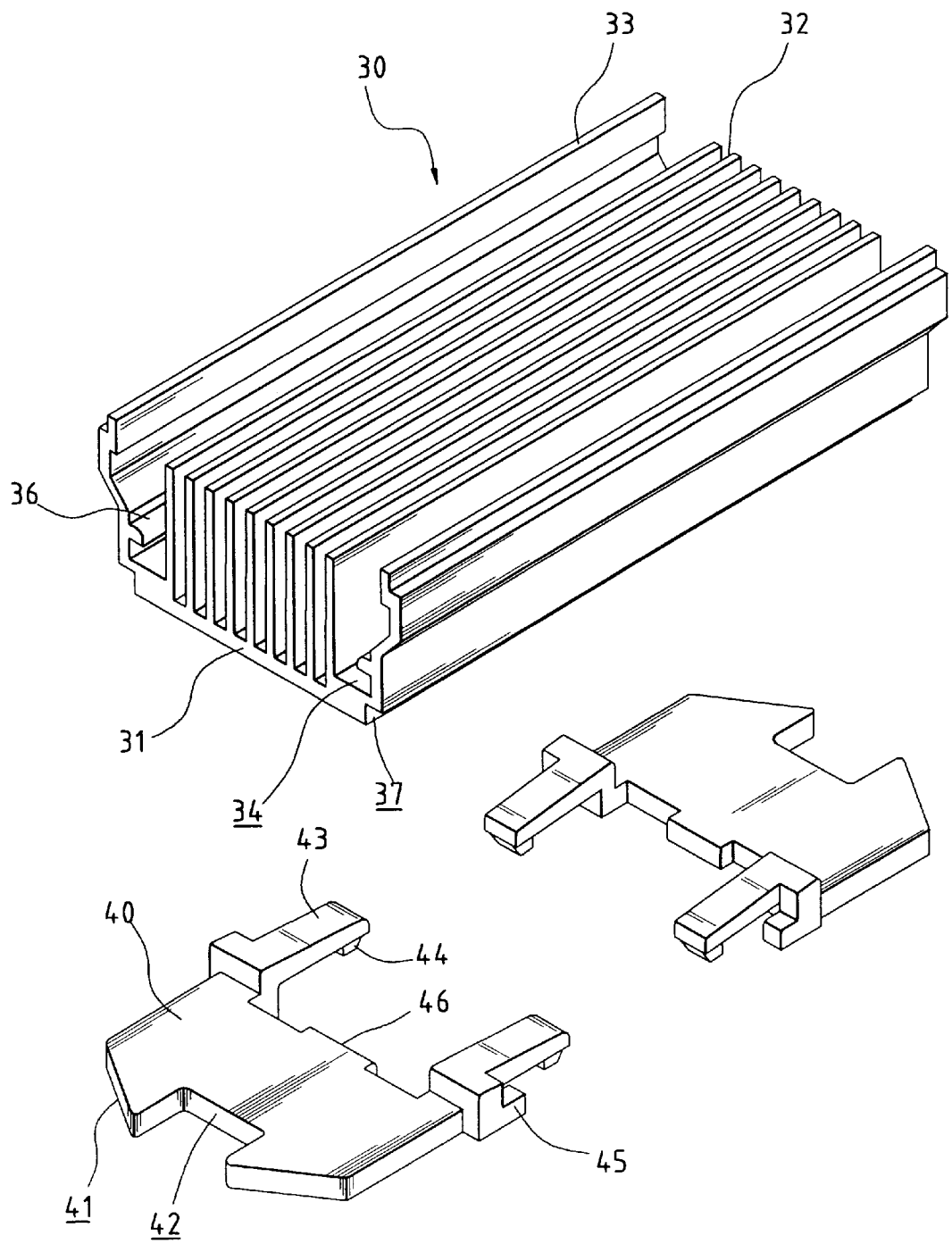
FIG. 4 is an exploded view of the present invention.
Figure 5:
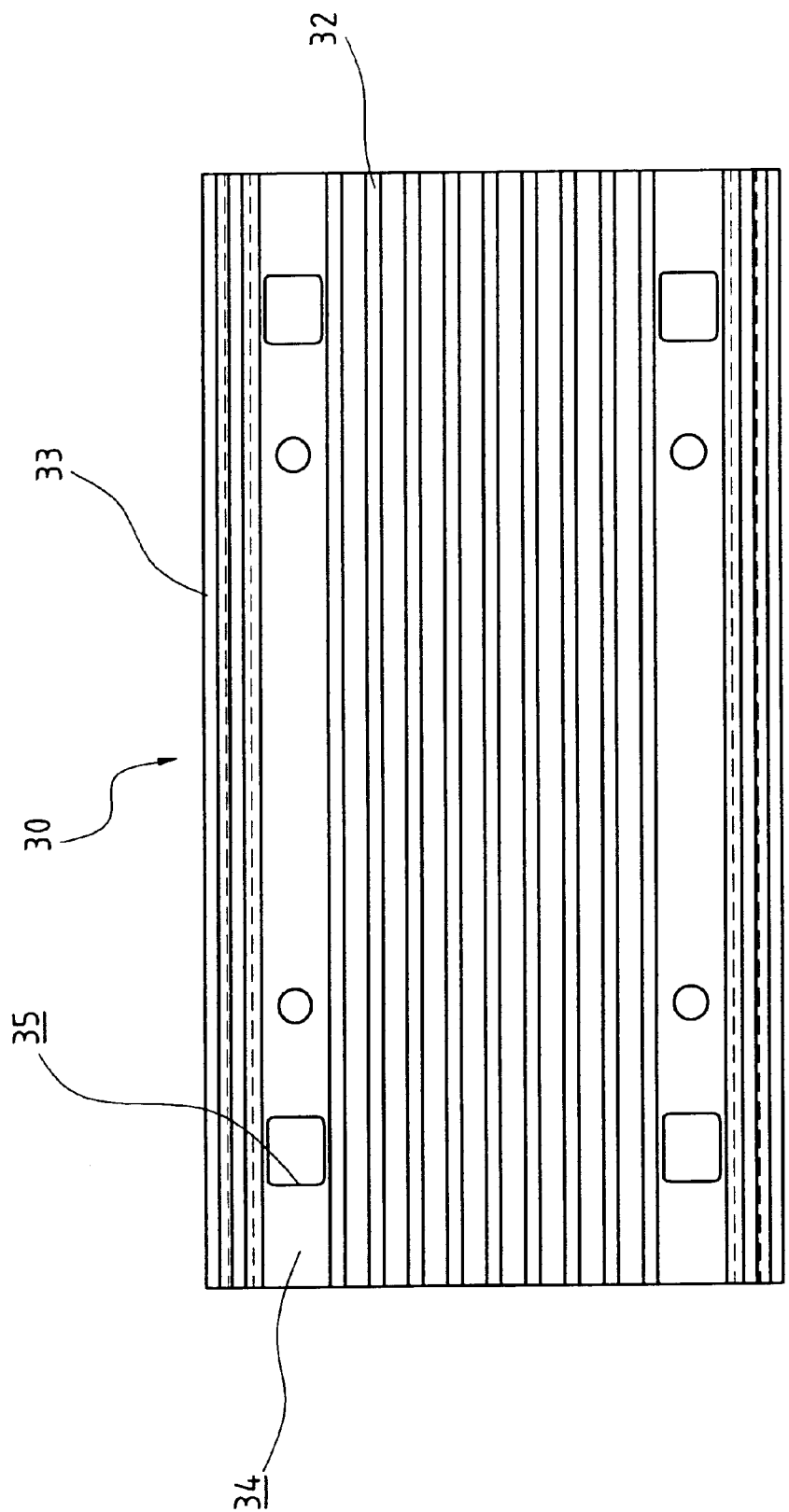
FIG. 5 is a bottom view of the radiating fin assembly of the present invention.
Figure 6:
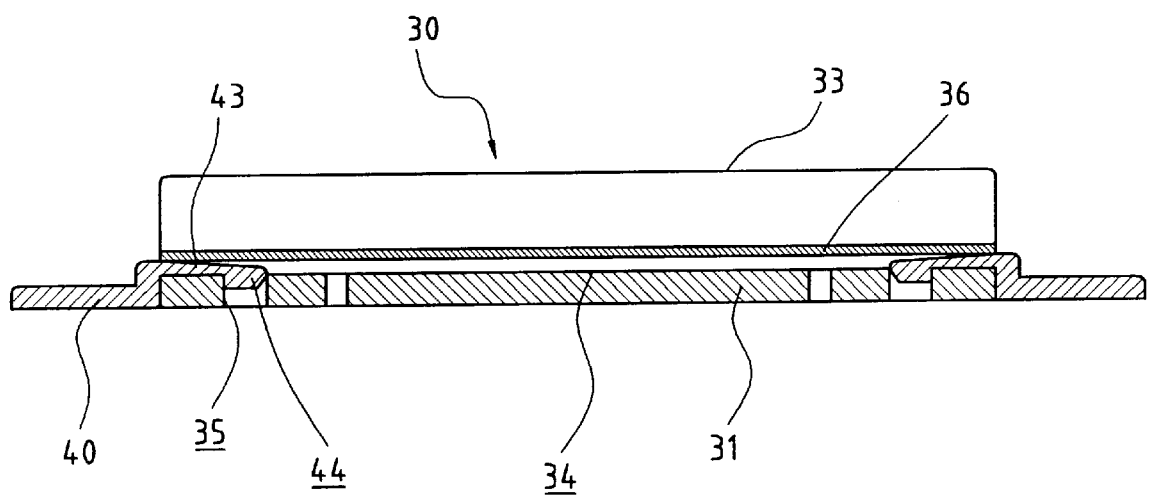
FIG. 6 is a cross sectional view of the invention shown in FIG. 3.

As shown in FIGS. 3 and 4, the perspective view and the exploded view of the invention are illustrated. The radiator of the present invention includes a radiating fin assembly 30, and two buckling devices 40.

In the assembly 30, a plurality of transversal radiating fins 32 are installed on a seat 31. A pair of opposed channels 34 are formed between the outermost two radiating fins 33 and their adjacent inner radiating fins 32. Each buckling device 40 includes a buckling hole 45 that is installed within each channel 34. An inward protruded confining track 36 is formed in the inner lateral surface of each radiating fin 33.

A slot 37 is formed between the lower end of each radiating fin 33 and the seat 31. A buckling portion 44 is formed at the front lower surface of each buckling piece 43 for insertion into a channel 34 and then is buckled into a buckling hole 35 formed in the bottom of each channel 34. The buckling device 40 is combined with the radiating fin assembly 30, and a stopping rod 45 is protruded from the outer rim of the lower side of each buckling piece 43 and is inserted into a slot 37 for matching the resisting force for buckling the buckling device 40 provided by the buckling piece 43 so that the buckling device 40 will not easily separate from the radiating fin assembly 30.

In assembling, the buckling devices 40 are installed at the two opposite sides of the radiating fin assembly 30 and the buckling pieces 43 are inserted into the channels 34. The upper ends of pieces 43 are confined by the confining tracks 36. By the characteristics of the preferred plastic material forming devices 40, a proper elasticity is induced. Thus, the buckling portion 44 of the front end of each buckling piece 43 will enter into the channel 34 until it enters into a corresponding buckling hole 35. Meanwhile, since the protruded height of the buckling pieces 43 is correspondent to the width of the seat 31, the bottom of the buckling device 40 is at the same plane as the bottom of the radiating fin assembly 30 and the stopping rods 45 will insert into the slots 37. Therefore, the buckling device 40 is confined by the confining track 36 and the stopping rods 45 so that it cannot move either upwards or downwards. By engaging each buckling portion 44 with a buckling hole 35, the buckling device 40 cannot be pulled out from the radiating fin assembly 30.

By assembling the radiating fin assembly 30 and the buckling device 40, openings 42 at two opposite sides of the radiating fin assembly 30 are formed. Thus, regardless of upright or transversal radiating fin assembly 30, after the radiating fin assembly 30 is formed by compressing, and without subsequent punching or cutting of the fins, the completed radiating assembly can be easily assembled to the CPU. This is advantageous in cost-savings and work hours.

The two buckling devices 40 are preferably made from a plastic material and each first side thereof has a pair of respective inclined edges 41. The concave opening 42 is formed between the two inclined edges 41 for connection with a CPU frame. Another second side is provided with the two buckling pieces 43. The height of the buckling pieces 43 corresponds to the width of the seat 31.

Although the present invention has been described with reference to the preferred embodiments, it will be understood that the invention is not limited to the details described herein. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A radiator comprising:

a radiating structure including a plurality of radiating fins installed on a seat, a pair of channels formed between a pair of outermost radiating fins and a pair of adjacent inner radiating fins; a buckling hole formed in each channel; an inward protruded confining track formed in an inner lateral surface of each of said outermost radiating fins; a slot between a lower end of each outermost radiating fin and said seat;

two buckling devices, two buckling pieces protruding from one side of each buckling device, a buckling portion at a front lower surface of each buckling piece for insertion into said channel and into a buckling hole to combine said buckling device with said radiating structure; and a stopping rod protruded from an outer rim of said lower side of each buckling device, the rod being inserted into said slot for matching the resisting force for buckling said buckling device provided by said buckling pieces so that said buckling device will not separate from said radiating fins.

2. The radiator as claimed in claim 1, wherein said buckling device is made of an elastic plastic material.

3. The radiator as claimed in claim 1, wherein two inclined edges are disposed at a first side of each buckling device, and a concave opening is formed between said two inclined edges.

4. The radiator as claimed in claim 1, wherein said radiating fins are transversal radiating fins.

5. The radiator as claimed in claim 1, wherein the height of said buckling pieces is correspondent to the width of said seat.

6. The radiator as claimed in claim 1, wherein said radiating fins are upright radiator fins.

\* \* \* \* \*